INVENTORS.
Paul S. Citrin
BY Frank J. Gurski
Robertson, Bryan, Parmelee & Johnson
ATTORNEYS.

INVENTORS.
Paul S. Citrin
BY Frank J. Gurski

Robertson, Bryan, Parmelee & Johnson
ATTORNEYS

INVENTORS
Paul S. Citrin
BY Frank J. Gurski
Roberts, Bryan, Parmelee & Johnson
ATTORNEYS INVENTORS.
Paul S. Citrin
BY Frank J. Gurski Robertson, Bryan, Parmelee & Johnson
ATTORNEYS.

United States Patent Office 3,687,731
Patented Aug. 29, 1972

3,687,731
METHOD AND APPARATUS FOR CLEANING CAPILLARY SIZED HOLES IN ARTICLES

Paul Stuart Citrin, New Milford, and Frank Joseph Gurski, Jr., Brookfield, Conn., assignors to Sieburg Industries Incorporated, Danbury, Conn.

Filed May 21, 1970, Ser. No. 39,230
Int. Cl. B08b 91/00
U.S. Cl. 134—22 R 21 Claims

ABSTRACT OF THE DISCLOSURE

The capillary of an article is cleared of foreign materials by a liquid ram having a pressure exceeding 25,000 p.s.i. The apparatus may also include a drying station utilizing gas flow through the capillary, and elevator means for seating the article in cleaning position having force-limiting means to prevent damage to the article.

This invention relates to a method and apparatus for working capillary sized holes. More specifically this invention relates to a method and apparatus for cleaning capillary sized holes in articles such as tips employed for wire bonding in thermal compression and ultrasonic bonding and the like.

In a method and apparatus in accordance with the invention a capillary hole in an article is cleaned by subjecting an end of the article capillary to a supply of liquid at a very high pressure. The liquid pressure is selected so high that materials clogging the capillary are ejected and the capillary is cleaned.

The method and apparatus of this invention are advantageously employed in the cleaning of capillaries in tips used in wire bonding processes such as thermal compression bonding. Thermal compression bonding as used in the manufacture of electronic semiconductor devices involves the formation of electrical interconnections by bonding a fine gold wire to selected areas on a semiconductor device with the aid of heat and pressure from a tip. The fine gold wire is threaded through a capillary in the tip to the heated tip and where the gold wire is pressure bonded to the semiconductor device. Typically, a capillary diameter is of the order of .001 inch diameter, and the gold wire of the order of .0007 inch diameter.

During use of the tip foreign materials carried by the wire or portions of the wire may prematurely clog or hamper the wire feed through the capillary, with a resultant loss of service from the tip. Attempts to clean an obstructed capillary have encountered severe problems. Typically a metallic rod of suitable hardness and diameter would be driven into the capillary to dislodge the foreign material. However, the small diameter rod often breaks during the cleaning with a portion of the rod remaining stuck in the capillary. The frequent loss of the rod and operator time consumed while making a fruitless attempt to clean a capillary made discard of a clogged tip more practical.

In the method and apparatus of this invention capillaries in articles such as encountered in tips used in wire bonding may be unplugged and cleaned to recover capillaries previously considered lost. The short time needed to clean a capillary in accordance with the invention advantageously enables one to maintain a tip in operative condition for an increased useful life.

In a capillary cleaning apparatus in accordance with the invention the capillary in an article may be worked with a high pressure liquid ram which advances liquid through the capillary at a velocity sufficient to clean the inside of the capillary without breakage or loss from handling the article. The liquid ram may be generated with pressures of the order of 100,000 pounds per square inch to assure the removal of foreign materials from the capillary and provide a clean reusable article.

It is, therefore, an object of the invention to provide a method and apparatus for working capillaries in articles.

It is a further object of the invention to provide a method and apparatus for cleaning capillaries in articles in a reliable, economic and practical manner and obtain an extended operative life time for the article.

These and other objects and advantages of the method and apparatus of the invention may be understood from the following description of a capillary cleaning apparatus for tips in conjunction with the drawings wherein FIG. 1 is a perspective view of a tip cleaning apparatus in accordance with the invention;

A capillary sized hole as described herein means a hole in an article wherein the hole cross-section is sufficiently small to be practically capable of being worked as described with a high pressure liquid ram in accordance with this invention without injury to the article.

Figures 1, 7:
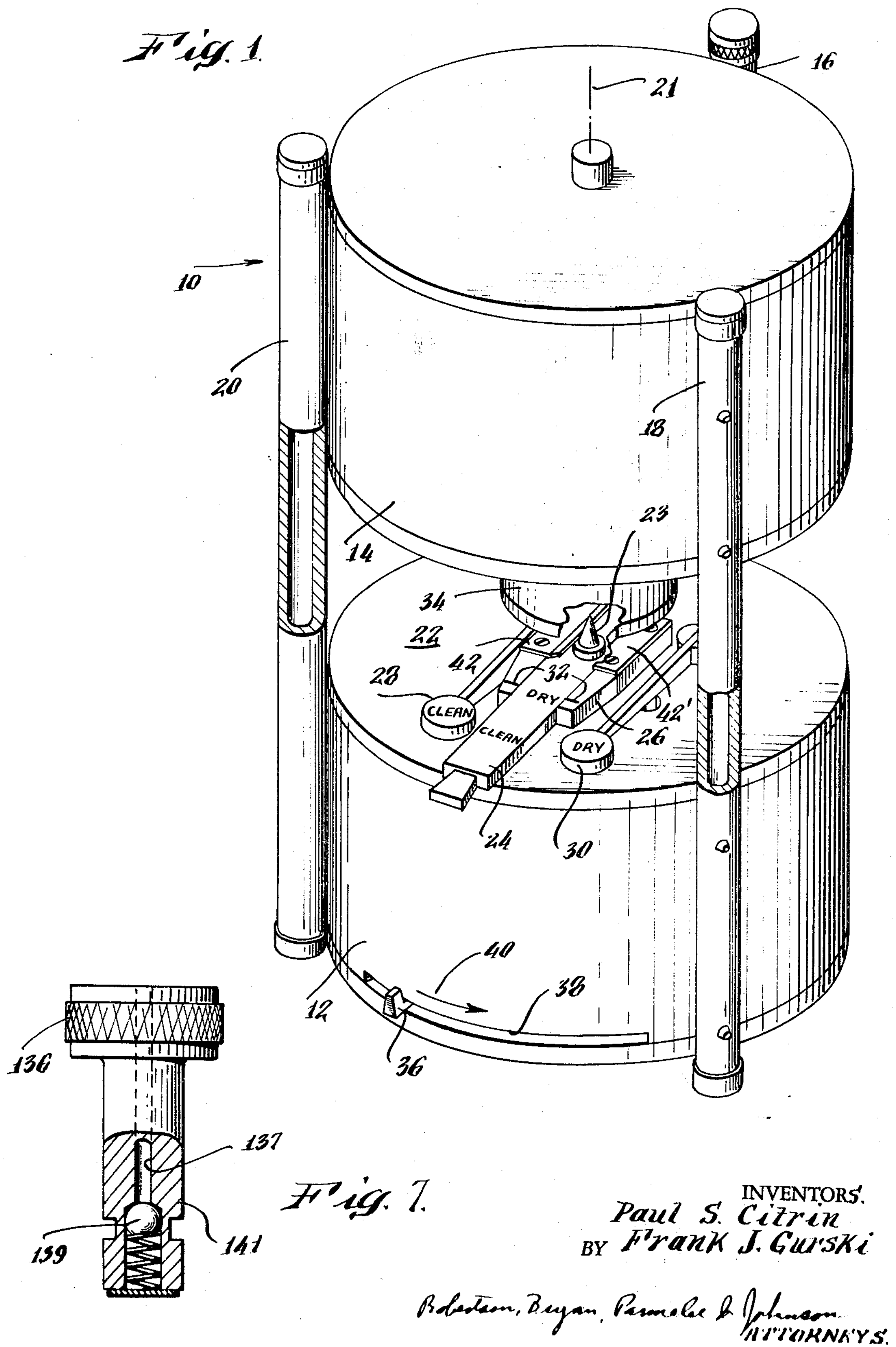
FIG. 7 is a side view of an alternate liquid fill cap for use with the tip cleaning apparatus of FIG. 1.

With reference to FIG. 1 a capillary cleaning apparatus 10 is shown and particularly adapted to clean tips used for wire bonding.

The cleaning apparatus 10 is formed of two vertically disposed cylindrical sections 12–14 spaced from each other by three tubular legs 16, 18 and 20 to define an article working station 22 between the sections. Legs 16–20 are equiangularly spaced about a central axis 21. Leg 16 supplies liquid to the operating region of the apparatus and legs 18–20 provide gas flow passages between sections 12–14.

At the article working station 22, an article 23 is supported on a slide 24 which is located for radial movement into and out of station 22. The slide 24 is mounted with low sliding friction to a slide platform 26 disposed for vertical displacement on lower section 12.

Adjacent slide 24 are a pair of actuator levers 28–30 respectively operatively connected to valves in lower section 12 to commence an article cleaning and article drying operation. Slide 24 is mounted with detents to slide platform 26 to provide accurately registered successive article working positions. The successive detent positions of slide 24 correspond with the placement of the slide labels "clean" and "dry" between the registration lines 32. A third article loading indent position, labelled "load" is provided and the "load" label becomes visible when the slide 24 is fully retracted from the platform 26.

The radial retractive and insertion movement of slide 24 on lower section 12 is precisely registered relative to a housing 34 depending coaxially from upper section 14 into the article working station 22. Articles 23 is vertically moved into operative contact with the housing 34 as controlled by the movement of lever 36 along slot 38 in the direction indicated by arrow 40. A pair of hold down plates 42–42' extend from platform 26 over slide 24 to aid in the downward return of article 23 when lever 36 is returned to the position as shown in FIG. 1.

Figure 2:
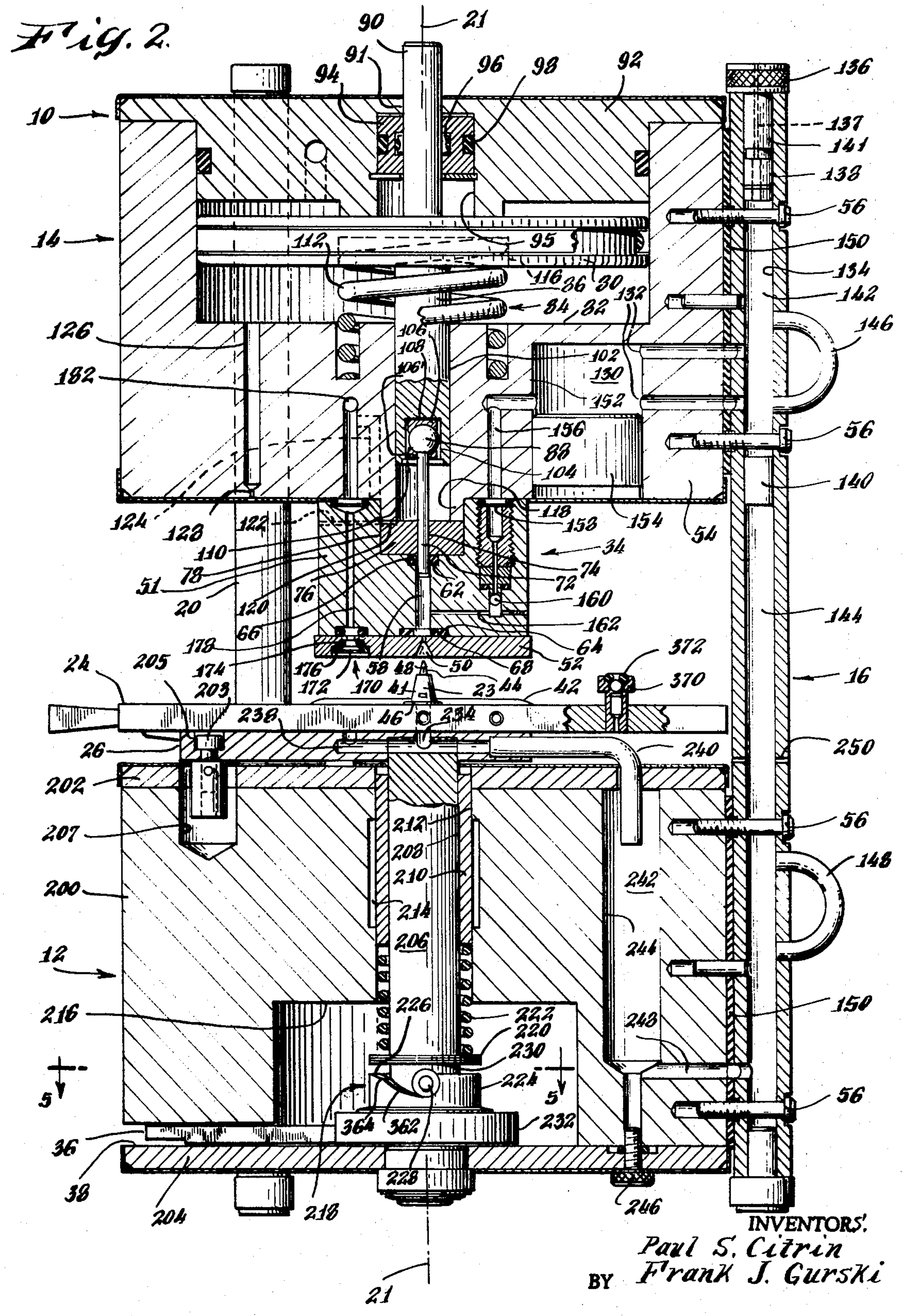
FIG. 2 is a vertical section of the tip cleaning apparatus shown in FIG. 1.

The section view of FIG. 2 provides further detail of the structure of the capillary cleaning apparatus 10. An article such as a tip 23 used in thermal compression bonding processes is shown mounted on slide 24 with the latter in the "clean" position. Tip 23 is formed of a main section 41 and a tungsten carbide conical insert end section 44. A portion of main section 41 seats in a hole in slide 24 (see FIG. 3) with a circular flange 46 resting on top of slide 24 underneath hold down plate 42. The tungsten carbide insert end section 44 is provided with a capillary sized hole 48 which, in the clean position of slide 24, is aligned with axis 21. The capillary 48 extends through the insert 44 to a larger coaxial bore to form a continuous passage for a gold bonding wire (not shown).

The visible portion of insert 44 is conically shaped with a solid angle of 30°. The apex of the cone has a carefully controlled shape with the capillary 48 terminating at the apex.

With the tip 23 in the clean position as shown in FIG. 2 its capillary 48 is aligned with and faces a high pressure conically shaped outlet port 50 in housing 34. Housing 34 is formed of a cylindrical intensifier barrel 51 covered by a guide plate 52. Intensifier barrel 50 is connected to cylindrical upper barrel 54 which in turn is supported by the legs 16 through 20 with screws such as 56.

Cleaning of tip 23 is accomplished with a high pressure liquid under control by a pneumatic actuated mechanism. The supply of liquid and pneumatics is obtained essentially without tubing through internal manifolding to assure a clean contaminant free fluid system for cleansing of the article capillary.

The intensifier barrel 51 is provided with a coaxially located high pressure working chamber 58 in the shape of a cylinder which terminates at ends of the barrel 51 in counter bores 62–64. Counterbore 62 is occupied by a high pressure low friction sliding seal 66 and a static high pressure seal 68 is located in counterbore 64. Guide plate 52 is firmly connected to intensifier barrel 51 with screws (not shown). Conical port 50 communicates through a small cylindrical bore 70 (see FIG. 3) with the high pressure working chamber 58.

An intensifier shaft 72 is mounted for sliding movement in cylinder 58 to pressurize liquid therein. Shaft 72 fits through a bore 74 in an extrusion bearing 76. Bearing 76 in turn is accurately centered in a counterbore 78 of intensifier barrel 51 to align the intensifier shaft with cylinder 58.

Extrusion bearing 76 provides both a guide bearing for intensifier shaft 72 as well as a controlled clearance around the shaft to prevent seal 66 from being extruded during high pressure working in cylinder 58.

Static annular seal 68 is firmly held by the retention of guide plate 52 to intensifier barrel 51.

Intensifier shaft 72 is driven by a drive piston 80 operatively mounted in a cylinder bore 82 of upper barrel 54. Piston 80 is affixed to an axial piston shaft 84 having a downward extension 86 connected through a spherical bearing 88 to intensifier shaft 72. An upward extension 90 of piston shaft 84 slidingly protrudes through a bore 91 in an end cap 92 which also seals the upper end of cylinder bore 82.

Upper extension 90 of piston shaft 84 slides through a resilient bearing 94 mounted in an axial counterbore 95 in end cap 92. Extension 90 is sealed with bearing 94 with a low friction seal 96. The resilient bearing 94 is sealed to wall of counter bore 95 with an O ring seal 98. A retainer 100 holds bearing 94 in its proper position in counterbore 95.

The resiliency of bearing 94 advantageously compensates for eccentricities between the piston shaft 84 and the end cap 92.

Downward extension 86 of piston shaft 84 is slidingly mounted in an axial bore 102. The spherical ball bearing 88 is located in an axial bore 104 in the bottom of piston shaft 84. The spherical bearing provides automatic alignment compensation between the motion of the drive piston 80 and that of intensifier shaft 72. The spherical ball bearing 88 includes upper and lower spherical washers 106–106' on opposite sides of ball 88 and respectively located adjacent the bottom of bore 102 and the intensifier shaft 72. Shims, such as 108 are employed to locate the bottom end of intensifier shaft 72 substantially flush with the guide plate 52 when shaft 72 is in the down position. Retainer 110 holds the spherical bearing assembly in the bore 104.

A return spring 112 is coaxially mounted with the lower extension 86 of piston shaft 84. Spring 112 is seated in an annular slot 114 in the upper barrel 54 and an annular slot 116 in the piston 80. Slots 114 and 116 are sized to receive the entire compressed spring 112 when the piston 80 has bottomed out in the cylinder bore 82.

Pressure gas for downward action of piston 80 is supplied through a suitable port interconnecting the power gas containing passage in leg 20 with the portion of the cylinder bore 82 located above piston 80.

Upper barrel 54 is provided with an annular shoulder 118 which seats on extrusion bearing 76 to firmly hold bearing 76 against the bottom of counterbore 78 in the intensifier barrel 51. A gas escape passage 120 is provided in the form of a radial undercut groove in the extrusion bearing 76. Groove 120 terminates opposite a radial passage 122 in the intensifier barrel. Passage 122 extend radially to ambient. Discharge of gas below piston 80 occurs through an axially parallel passage 126 which terminates at the bottom of upper barrel 54 in a fixed flow control orifice 128. Orifice 128 opens to ambient pressure and is sized to limit the downward speed to piston 80 within acceptable levels.

Liquid for the high pressure working cylinder 58 is obtained from a liquid storage reservoir 130 connected through radial passages 132 to the bore 134 of leg 16. The bore 134 is closed on top of leg 16 by a removable liquid fill cap 136 above a liquid filter 138. A vent passage 137 is provided through fill cap 136. A plug 140 divides the bore 134 into an upper fresh liquid containing passage 142 and a lower used fluid passage 144. A pair of transparent liquid gauge loops 146–148 are operatively connected with passages 142–144 respectively, to provide a visual indication of the liquid levels. Gaskets 150 are located between leg 16 and upper and lower sections 12 and 14. FIG. 7 illustrates a fill cap 136 having a check valve 139 located in a liquid pressurizing piston extension 141. The check valve 139 enables one to drive liquid into the high pressure working chamber for liquid priming of connecting passages.

The liquid storage reservoir 130 is formed by a bore 152 and a plug 154 in upper barrel 54. The liquid in the reservoir is supplied to the high pressure working cylinder 58 through an internal axially parallel passage 156, a liquid filter 158 and a check valve 160. A radial internal passage 162 couples the output of liquid check valve 158 to the high pressure working cylinder 58. The passage 162 is firmly plugged at its radial extremity. Note that these liquid passages are internal and eliminate external tubing with the usually associated fittings.

A drying station 170 is located opposite the "dry" detent position of slide 24. This drying station is formed by a port 172 in guide plate 52. Port 172 is provided with a floating O ring seal 174 located in suitable counterbore and held in position with a retainer ring 176. Port 172 is in gas flow communication with a bore 178 in intensifier upper barrel 51 and bore 180 in upper barrel 54. A radial passage 182 couples passage 180 with the passage in leg 18 not visible in the view of FIG. 2. Leg 18 is provided with a dry pressurized gas to dry the capillary 48 when tip 23 is placed in operative position with the drying station 170.

Slide 24 and the slide platform 26 are supported by the lower section 12. Lower section 12 includes a cylindrical lower barrel 200 covered by a circular top plate 202 and a circular bottom plate 204. As may be appreciated in the view of the cam control 218 in FIG. 1, the movement of lever 36 in a radial plane causes shaft 206 to rise and seat tip 23 into conical port 50.

The slide platform 26 is vertically moved by a coaxial shaft 206 connected to the platform 26. Shaft 206 slides in a through bore 208 of a bushing 210 mounted in a bore 212 in lower barrel 200. Bore 212 is undercut along a central region to define an annular manifold 214 between the outerwall of bushing 210 and the wall of undercut bore 212.

Shaft 206 extends downwardly into a counterbore 216 in lower barrel 200 where shaft 206 is connected to a cam control 218. Shim discs 220 are interposed between the shaft 206 and the cam control 218 to effectively vary the length of shaft 206 and obtain precise vertical seating of tip 23 in port 50 of housing 34. A return spring 222 is located between shim discs 220 and the bottom axial end of bushing 210 to spring bias the entire slide 24 and platform 26 in a down retracted position as well as maintain operative contact in the cam control 218.

The cam control 218 includes an annular symmetrical cam 224 having an axial facing, annular symmetrical cam surface 226. Cam surface 226 is engaged by a pair of cam followers 228–228' (only 228 being visible in the view of FIG. 1) mounted to a shaft extension 230. Cam 224 is radially coupled to a cam collar 232 which is connected to lever 36 for control and actuation. Cam collar 232 rotates relative to bottom plate 204. As may be appreciated in the view of the cam control 218 in FIG. 1, the movement of lever 36 in a radial plane causes shaft 206 to rise and seat tip 23 into conical port 50.

Slide platform 26 is provided with a vertical passage 234 into which the tip 23 is seated. Passage 234 terminates in a horizontal passage 238. A tube 240 interconnects passage 238 with a used liquid reservoir 242 located in the form of a bore 244 in the lower barrel 200. A removable thumb screw 246 is located in alignment with bore 244 to remove used liquid. A radial passage 248 couples the reservoir 242 with the lower passage 144 of leg 16 to register an indication of the level of liquid in reservoir 242. A vent 250 is provided in leg 16 to vent gasses from passage 144.

Figure 4:
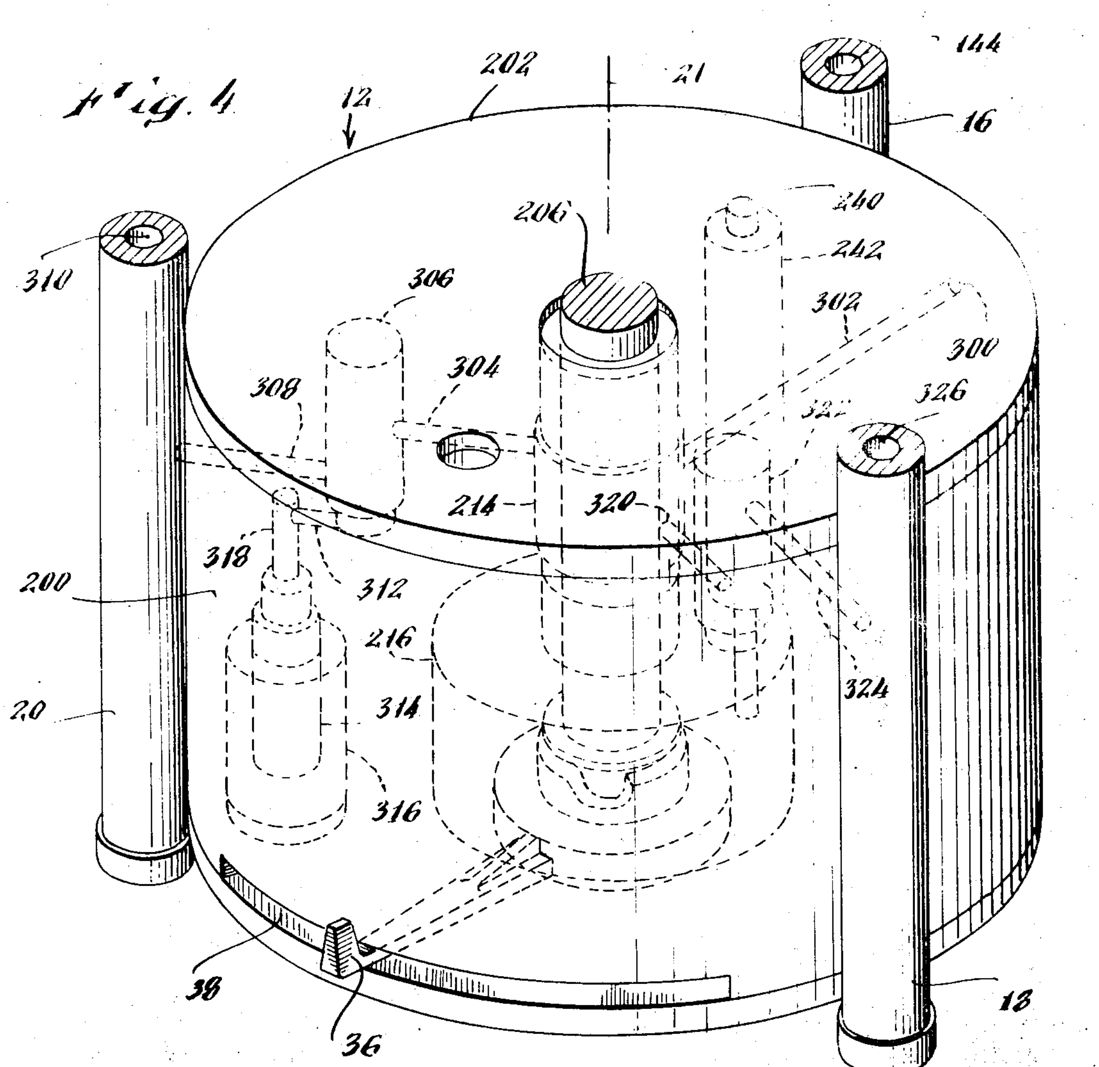
FIG. 4 is a perspective view of a lower barrel employed in the tip cleaning apparatus of FIG. 1 to illustrate internal manifolding and pneumatic controls used in a tip cleaning apparatus in accordance with the invention.

FIG. 4 shows the pneumatic controls and internal passages employed in the operation of the apparatus. A single pneumatic inlet 300 is shown at a radial peripheral location of lower barrel 200 and is provided with suitable fittings for connection to an air line (not shown). A main inlet passage 302 extends radially inwardly to the manifold 214. A power outlet passage 304 is provided along a radial line to an axially parallel bore 306 sized to hold a three way valve (not shown). The valve placed in bore 306 is of known design.

In a first normally deactivated position of the valve in bore 306 (release of lever 28 shown in FIG. 1) the pneumatic power carrying radial passage 304 is interconnected to a radial passage 308. Radial passage 308 in turn connects to passage 310 in leg 20 for producing a power stroke from the piston 80 (FIG. 2).

In a second active position of the valve in bore 306, (depression of lever 28) a gas flow path is formed between radial passage 308 and radial passage 312 to a manually-set flow control valve 314 located in an axially aligned counter bore 316. A bore 318 intersects radial passage 312 so that a gas flow path to ambient is provided through the flow control valve 314. This latter valve thus controls the rate at which piston 80 (see FIG. 2) is allowed to return to its spring biased up position upon depression of clean lever 28.

Another power gas passage 320 extends radially outward to an axially parallel bore 322 sized to retain a two way valve, which when actuated by the "Dry" lever 30 (see FIG. 1) provides gas flow into a radial passage 324. Passage 324 is in gas flow communication with passage 326 in leg 18 to supply drying gas to the drying station 170 (see FIG. 2).

These several radial passages such as 320 and 312 are formed by drilling radially inwardly into the lower barrel 200 followed by supplying suitable plugs to seal selected radially outward portions of the drilled holes. Interconnections with leg passages are accompanied with seals and gaskets to form pneumatically tight interconnections. The valves in bores 306 and 322 have preselected spring biased normal positions as described to return the levers 28 and 30 (see FIG. 1) upon release to their normally raised pivot positions.

Figures 3, 6:
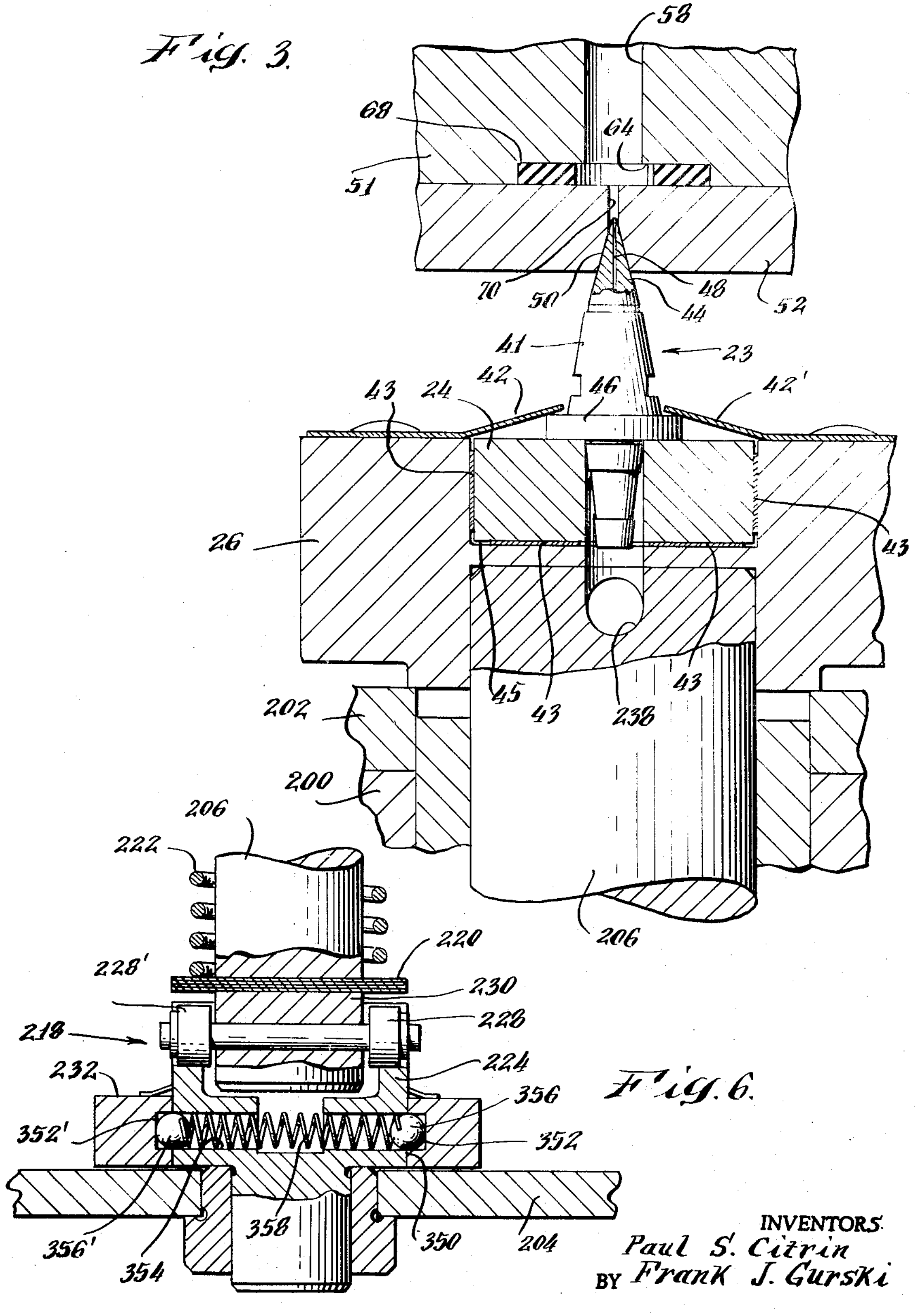
FIG. 3 is a partial enlarged section view of the tip cleaning apparatus with a tip in position to be cleaned.
FIG. 6 is a section view of the seating force producing mechanism taken along the line 6—6 in FIG. 5.
Figure 5:
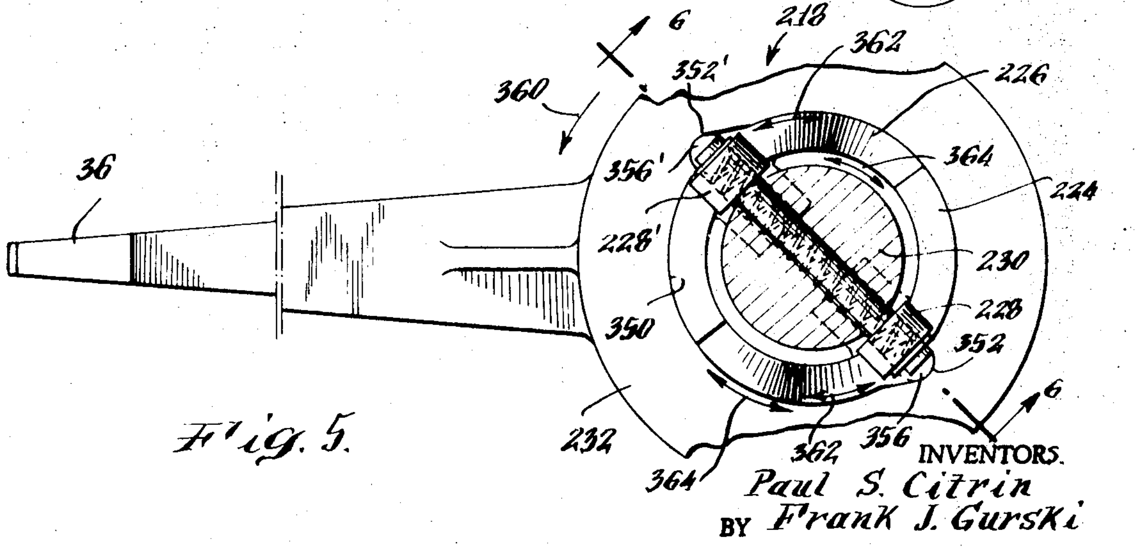
FIG. 5 is a section view of a force producing mechanism to seat a tip and is taken along the line 5—5 in FIG. 2.

The seating of the tip 23 onto the conical seat formed by port 50 in housing 34 is controlled within a limited force to prevent damage of the tip. For this purpose a torque limiter is operatively interposed between the vertical positioning lever 36 and cam 224. With reference to FIGS. 5 and 6 the features of the torque limiter are shown.

The collar 232 is shown as an integral cylindrical end portion of lever 36 and is provided with a through bore 350. A pair of detents 352–352' are formed at 180° angular spacing of each other with a shape as shown in FIG. 5. The detents 352–352' are aligned with a radial through bore 354 in the came 224. A pair of balls 356–356' are urged into detents 352–352' by a spring 358. When the movement of lever 36 and collar 232, in the direction of arrow 360, introduces a torque in excess of a predetermined level the balls 356–356' are driven out of the detents into bore 354 to effectivey disengage the lever 36 from the cam 224. The torque at which this release occurs is determined by the force exerted by spring 358.

In the operation of the article capillary cleaning apparatus 10 a tip 23 is loaded in slide 24 and moved with capillary 48 aligned under port 50 of housing 34. As shown in FIG. 3 the annular shoulder 46 seats below hold down plates 42–42'. Thereupon lever 36 (See FIG. 1) is moved to drive cam surface 226 under cam followers 228–228'. The cam surface 226 is formed of two similar diametrically opposite surface sections for operation against both cam followers 228–228'. Each operative cam surface section is formed of a fast rising high slope region 362 and a slow rising low slope end region 364 (See FIGS. 2 and 5). The number of shaft mounted shim discs 220 is selected so that the tip 23 is seated in port 50 as shown in FIG. 3 when the cam followers 228–228' are in contact with the low slope end regions 364 of the cam surface 226. The spring 354 in the detent release mechanism is selected so that the release goes into effect while cam followers 228–228' are over the low slope end regions 364 of the cam surface 226.

After the tip 23 is in the raised position in contact with port 50 its capillary 48 is aligned as shown in FIG. 3. Note the self aligning feature of the conical shape of port 50.

FIG. 3 reveals lubricating type shims 42 used between the slide 24 and the platform 26. Shims 43 may be made of a material such as Teflon impregnated fiberglass tape. The platform 26 is provided with a rectangular slot 45 slightly oversized relative to slide 26 to allow the lubricating shims 23 to be employed.

At the time of seating of tip 23, the intesifier shaft 72 was in its normally down position flush with the surface of guide plate 52. The clean lever 28 is depressed causing an actuation of the three-way valve in the bore 306 (See FIG. 4) and allowing piston 80 (See FIG. 2) to rise under action from return spring 112. The upward movement of piston 80 retracts intensifier shaft 72 from high pressure working cylinder 58 and liquid from reservoir 130 is drawn past check valve 160 into cylinder 58. The entry of gas through capillary 48 is considered negligible.

Upon release of clean lever 28, full gas power is again applied to the top of piston 80 tending to drive the intensifier shaft into the now liquid filled cylinder 58. The downward force of intensifier shaft 72 on the liquid produces an enormous pressure determined by the ratio of the effective areas of piston 80 and intesifier shaft 72 and the pneumatic pressure on piston 80.

In one cleaning apparatus the piston 80 was provided with a surface area of about 12.8 square inches and the intensifier shaft with a surface area of .0123 square inch for a ratio of about 1000. With a pneumatic pressure in the range of from 60 to 120 pounds per square inches enormous liquid pressures in excess of 100,000 pounds per square inches became available to unclog a capillary 48.

As soon as the capillary becomes unclogged a high speed liquid flow occurs through the capillary since piston 80 continues to force the intensifier shaft 72 into the liquid filled cylinder 58. This high velocity liquid flows sufficiently fast to effectively scour the walls of the capillary from undesired materials and produce a cleaned reusable tip 23.

The liquid passed through the capillary 48 is channelled through passage 206 and tube 240 for collection in the used liquid retaining reservoir 242. One may appreciate from the relative sizes of cylinder 58 and reservoirs 130 and 242 that a multiple number of cleaning steps can be conducted before the reservoir 242 is filled.

The enormous pressure developed in cylinder 58 is selectively applied to the tip 23 as may be especially appreciated in the view of FIG. 3. The total tip surface area exposed to the high working pressure is limited to essentially the cross-sectional area of the small cylindrical bore 70. On the other hand the guide plate 52 has a much larger surface area exposed to the enormous pressure and may deflect, thereby tending to increase and improve the metal to metal seal between insert 44 and conical port 50. The small cross-sectional area of bore 70 advantageously reduces the total downward area force on tip 23 to acceptable low values.

The completion of a cleaning operation may be conveniently observed by the retraction of the visible protruding upper extension 90 of piston shaft 84. After the capillary 48 is cleaned, the lever 36 is returned to the tip retracted position and slide 24 is moved to the "dry" detent index position.

The tip 23 is raised again by actuation of lever 36 so that insert 44 operatively engages the floating O ring seal 174. At this time the dry lever 30 is actuated to send a rush of drying gas into passage 178 and through capillary 48 into passage 238. The gas flow is maintained for a time period sufficient to remove all liquid from the capillary.

When slide 24 is in the retracted "load" position, a ball check valve 370 is aligned with the port 50. Check valve 370 is provided with an O ring seal 372 that is sized to seat around the port 50 onto the lower surface of guide plate 52. Check valve 370 is spring biased closed. By raising the check valve 370 into operative contact with the guide plate 52 in a like manner as tip 23, the intensifier shaft 72 may be test actuated with a safe release of liquid.

The capillary cleaning apparatus has been described for cleaning tips used in wire bonding processes. It should be appreciated that other articles having capillaries may be accurately cleaned. Such otheraticles may have different shapes. Such shapes may be accommodated with corresponding reshaping of the guide plate 52 and its high pressure outlet port 50. The capillaries encountered in commercially available bonding tips and which can be cleaned in accordance with the invention may vary in diameters from as small as 0.005 inch to as large as 0.005 inch. The capillary cleaning in accordance with the invention is accomplished in a short time and highly suitable in support of production manufacturing of electronic devices.

The pressures found useful in the high pressure working chamber 58 may be established by varying the pressure applied to the top of piston 80. Pressures generally greater than about 25,000 pounds per square inch in chamber 58 were found useful in cleaning of capillaries.

Having thus described a capillary working apparatus its many advantages may be appreciated. The integral valving and pneumatic controls assure substantially contaminant free working of capillaries. Self aligning features provide a safe interference free development of high liquid working pressures.

What is claimed is:

1. A method of removing solid undesired materials clogging capillary sized holes in articles comprising the steps of positioning an article capillary to be cleared of undesired materials in liquid pressure and liquid flow communication between a supply of pressurized liquid and a medium at a lower pressure, increasing the pressure in the liquid supply above a predetermined minimum level selected to exceed about 25,000 pounds per square inch and form a liquid ram directed at the clogged capillary and forcing the liquid through the unclogged capillary at a high speed sufficient to scour the capillary.

2. The method of working capillary sized holes as claimed in claim 1 wherein said liquid supply is pressurized to a level of the order of 100,000 pounds per square inch.

3. The method of removing undesired materials from capillary sized holes as claimed in claim 1 wherein said high pressure capillary scouring step is followed with the steps of registering the unclogged scoured capillary in the article with a source of dry pressurized gas and supplying said dry pressurized gas to the registered capillary to remove liquid therefrom.

4. A method of cleaning capillary sized holes in conically shaped tips used in wire bonding processes for removal of clogging solid materials comprising the steps of positioning the small conical end of a tip with its capillary in liquid pressure and liquid flow communication with a supply of pressurized liquid, tightly sealing around the conical surface of the tip adjacent the capillary to reduce the tip area exposed to the pressurized liquid for reducing the force on the tip from the pressurized liquid, and increasing the pressure of the supply of liquid above a minimum level of at least 25,000 pounds per square inch to dislodge said materials and driving said materials out of the other end of the capillary to clean the capillary with the liquid driven through the capillary to form a reusable tip for wire bonding.

5. An apparatus for removing solid materials lodged within a capillary in an article such as tips employed in wire bonding processes comprising a housing having a high pressure liquid working chamber terminating at a liquid outlet port in a surface of the housing with the housing having sufficient strength to support fluid pressures in the chamber of the order of about one hundred thousand pounds per square inch, means for bringing the capillary of an article in liquid pressure and liquid flow communication with the housing liquid outlet port, with the article high pressure sealed around the capillary to prevent liquid leakage, means for pressuring a liquid in the chamber at a pressure selected to exceed a predetermined minimum pressure of at least twenty-five thousand pounds per square inch to form a liquid ram of sufficient strength to dislodge the solid materials from the capillary and scour said capillary when said liquid is driven through the unclogged capillary.

6. The apparatus for cleaning capillary sized holes as claimed in claim 5 wherein said pressurizing means further includes an intensifier shaft mounted for movement into and out of the liquid working chamber, said intensifier shaft being in close sealed relationship with the housing for pressurization of the chamber liquid above said predetermined minimum pressure, means for controlling the advance and return of the intensifier shaft, and alignment compensating means effectively interposed between the intensifier shaft and the controlling means to preserve the close sealed relationship of the intensifier shaft with the housing when said controlling means advances and returns the shaft.

7. The apparatus for cleaning capillary sized holes as claimed in claim 6 wherein said controlling means further includes a drive piston and cylinder operatively coupled to the intensifier shaft, with the effective surface areas of the drive piston and the intensifier shaft bearing an intensification ratio to each other selected to produce a liquid pressure in the high pressure chamber above said predetermined minimum to clean the capillary.

8. The apparatus for cleaning capillary sized holes as claimed in claim 5 wherein said means for bringing the capillary in liquid pressure and flow communication with the housing liquid outlet port further includes means for supporting the article, means for moving the supporting means and the liquid outlet port towards each other and seat the article with its capillary aligned with the outlet port sealingly against the housing, and means for limiting the seating force to a predetermined safe level.

9. The apparatus for cleaning capillary sized holes as claimed in claim 8 wherein said moving means includes a cam and a drive member coupled to the supporting means with the drive member provided with a cam follower located on the cam, said cam being oriented and shaped to advance the drive member and its coupled supporting means towards the outlet port and provide the force to seat the article sealingly against the housing.

10. The apparatus for cleaning capillary sized holes as claimed in claim 9 wherein said means for limiting the article seating force includes means for moving the cam and detent means operatively interposed between the cam and the cam moving means, said detent means providing positive interlock between the cam moving means and the cam below a predetermined seating force level and operatively disengages the cam moving means from the cam when said seating force exceeds said predetermined level.

11. An apparatus for removing undesired solid materials lodged within a capillary in a conically shaped bonding tip such as used in wire bonding processes comprising a housing having a high pressure liquid holding chamber capable of retaining liquid pressures of the order of one hundred thousand pounds per square inch, means for positioning an end of a capillary in a bonding tip in liquid communication with the high pressure liquid holding chamber, said positioning means including means to press the conical end of the tip against the chamber producing means and to effectively liquid seal the tip around the capillary end while said chamber retains a liquid ram forming pressure, means for maintaining the high pressure working chamber supplied with a liquid, means for pressurizing the liquid in the high pressure liquid holding chamber above a predetermined pressure level of at least twenty-five thousand pounds per square inch to form a liquid ram capable of unclogging the capillary in the bonding tip and clear the capillary from said undesired solid materials.

12. The apparatus for removing undesired materials from a capillary in a bonding tip as claimed in claim 11 wherein said positioning means further includes a guide member operatively interposed between the article and the high pressure liquid holding chamber, said guide member having one side shaped to sealingly receive and locate the smaller conical end of the bonding tip, said guide member being provided with a bore sized to slightly exceed the cross-sectional size of the capillary terminating in said smaller conical tip end, said bore being aligned between the capillary end and the high pressure liquid holding chamber to expose the bonding tip capillary to said highly pressurized liquid.

13. The apparatus for removing undesired materials from a capillary in a bonding tip as claimed in claim 12 and further including drying means for sealingly receiving an end of the capillary in the bonding tip to pass a flow of pressurized drying gas through the liquid cleaned capillary and dry the capillary.

14. The apparatus for removing undesired materials from a capillary as claimed in claim 11 wherein said means for pressurizing the liquid in said high pressure liquid holding chamber further includes an intensifier shaft disposed for movement in said chamber to displace liquid therein, wherein said high pressure liquid holding chamber further includes sealing means formed of a deformable ring seal adjacent an end of the chamber and a rigid bearing seal located to retain said deformable ring seal, said intensifier shaft being slidingly mounted through the sealing means in close sliding engagement with the rigid bearing seal to prevent said deformable seal from being extruded during high pressure working in the chamber.

15. The apparatus for removing undesired materials from a capillary as claimed in claim 14 wherein said means for pressuring the liquid containing high pressure chamber further includes a drive cylinder and drive piston operatively located therein, said drive piston being coupled to the intensifier shaft for advancement thereof, said drive piston and intensifier shaft having respective surface areas bearing an intensification ratio to one another sufficient to produce a liquid pressure in the high pressure working chamber above said predetermined minimum level.

16. The apparatus for removing undesired materials from a capillary as claimed in claim 15 wherein said drive piston and said intensifier shaft are disposed to operate along a common axis and a spherical bearing operatively interposed between the drive piston and said intensifier shaft to compensate for alignment deviations therebetween.

17. An apparatus for cleaning capillaries in tips used for wire bonding comprising an upper section housing and a lower section housing, tubular legs having passages, said legs mounted to said sections to maintain the sections vertically spaced from one another across a tip working region and provide fluid flow passages between the sections, said tubular legs being angularly distributed about an axis at selected angular locations.

a slide platform located on the lower section in the tip working region and vertically movably mounted thereto, and a slide mounted for movement in a radial plane along the slide platform to position a capillary of a tip substantially in alignment with the axis, said upper section including an intensifier barrel mounted coaxially in the tip working region, said barrel being provided with a high pressure liquid working cylinder aligned with the axis and facing the capillary of a slide positioned tip, means located in the lower section for raising the slide platform and slide positioned tip to sealingly seat the tip in contact with the upper section with the tip capillary exposed to the high pressure liquid working cylinder, an intensifier shaft mounted for liquid pressurization in the high pressure liquid working cylinder, means for supplying the high pressure working cylinder with a liquid, and means for applying a pressurizing force against the intensifier shaft to pressurize the liquid containing cylinder above a predetermined pressure level selected to drive a liquid ram through a capillary of the seated tip and clean the capillary.

18. The apparatus for cleaning capillaries in tips as claimed in claim 17 wherein the liquid supplying means includes a liquid reservoir located in the upper section, one of said tubular legs having a liquid supply passage in communication with the liquid reservoir, said upper section having an internal liquid passage interconnecting the high pressure working cylinder to the reservoir, and a check valve located in series with the internal liquid passage, said check valve being operatively oriented to pass liquid into the cylinder upon retraction of the intensifier shaft from the high pressure working cylinder and provide a high pressure seal upon the pressurization of the liquid by the intensifier shaft.

19. The apparatus for cleaning capillaries in tips as claimed in claim 18 wherein said means for pressurizing the intensifier shaft includes a drive piston and a drive cylinder located in the upper section with the piston in operative contact with the intensifier shaft, control means for pneumatically pressurizing the piston, said cleaning control means being disposed on the lower section and including another of said tubular legs to operatively couple the cleaning control means to the drive cylinder for piston power stroke actuation and liquid cleansing of the tip capillary.

20. The apparatus for cleaning capillaries in tips as claimed in claim 19 and further including means for drying the capillary of a cleaned tip, said drying means including a tip capillary drying station located along the moving path of the slide, a tip receiving drying port in the intensifier barrel, said upper section having interconnected drying gas passages coupling another of said tubular legs with the tip receiving drying port, and drying control means disposed on said lower section to control the flow of drying gas to said tubular leg for transmittal to the drying port.

21. The apparatus for cleaning capillary sized holes as claimed in claim 6 wherein said alignment compensating means is formed of a spherical bearing located between the controlling means and the intensifier shaft, to permit misalignment between the line of advance of the intensifier shaft and that of the controlling means while preserving the close sealed relationship of the intensifier shaft with the housing.

References Cited

UNITED STATES PATENTS

| | | | |
|---|---|---|---|
| 2,655,160 | 10/1953 | Casady et al. | 134—171 X |
| 2,827,063 | 3/1958 | Roy | 134—171 |
| 3,577,279 | 5/1971 | Lightner et al. | 134—23 |
| 2,689,075 | 9/1954 | Morton et al. | 141—20 X |
| 768,637 | 8/1904 | Thowless | 134—22 UX |
| 1,769,061 | 7/1930 | Hitchcock | 134—168 C |
| 2,412,531 | 12/1946 | Pape | 134—166 C |
| 2,935,073 | 5/1960 | Mycock | 134—171 |
| 3,013,570 | 12/1961 | Rose | 134—171 |
| 3,447,964 | 6/1969 | Koelichen | 134—22 |

FOREIGN PATENTS

| | | | |
|---|---|---|---|
| 1,189,962 | 4/1970 | Great Britain | 141—20 |

MORRIS O. WOLK, Primary Examiner

D. G. MILLMAN, Assistant Examiner

U.S. Cl. X.

134—17, 34, 82, 168 C, 171